United States Patent [19]

Harada

[11] Patent Number: 4,937,788
[45] Date of Patent: Jun. 26, 1990

[54] SEMICONDUCTOR MEMORY CIRCUIT WITH IMPROVED SERIAL ACCESS CIRCUIT ARRANGEMENT

[75] Inventor: Moemi Harada, Tokyo, Japan

[73] Assignee: NEC Corporation, Tokyo, Japan

[21] Appl. No.: 296,167

[22] Filed: Jan. 12, 1989

[30] Foreign Application Priority Data

Jan. 12, 1988 [JP] Japan ................................. 62-5232

[51] Int. Cl.[5] ............................................. G11C 13/00
[52] U.S. Cl. ............................... 365/189.04; 365/221; 365/230.05
[58] Field of Search ........... 365/221, 239, 240, 189.12, 365/119, 220, 189.04, 189.05, 230.05, 230.03, 230.08

[56] References Cited

U.S. PATENT DOCUMENTS

| | | | |
|---|---|---|---|
| 4,569,036 | 2/1986 | Fujii et al. | 365/230.03 |
| 4,758,995 | 7/1988 | Sato | 365/189.05 |
| 4,811,295 | 3/1989 | Shinoda | 365/219 |
| 4,819,213 | 4/1989 | Yamaguchi et al. | 365/219 |

Primary Examiner—Terrell W. Fears
Attorney, Agent, or Firm—Sughrue, Mion, Zinn, Macpeak & Seas

[57] ABSTRACT

A semiconductor memory circuit provided with an improved serial access circuit arrangement is disclosed. The memory circuit includes first and second memory arrays, a common data hold circuit, a first control circuit for enabling one of the first and second memory arrays, and a data transfer circuit which transfers data derived from the first memory array to the common data hold circuit when the first memory array is enabled and transfers data derived from the second memory array to the common data hold circuit when the second memory array is enabled.

7 Claims, 8 Drawing Sheets

SEMICONDUCTOR MEMORY CIRCUIT WITH IMPROVED SERIAL ACCESS CIRCUIT ARRANGEMENT

BACKGROUND OF THE INVENTION

1. Field of the Invention

The present invention relates to a semiconductor memory and more particularly, to a memory provided with at least a serial access port.

2. Description of the Related Art

With the progress in memory technology, dual-port memories equipped with a plurality of ports on one semiconductor chip have been developed and put into partical application in place of a conventional single-port memories. Since such a dual-port memory has a plurality of output ports on a single semiconductor chip, it has a large advantage in that a plurality of data can be processed asynchronously. In the field of image processing which has made a remarkable progress in recent years, for example, this dual port memory is used as a memory (referred to as a "video memory") for holding image data. The dual-port memory of this kind includes a random access port and a serial access port on the single chip. The random access port is the same as the port provided to a conventional RAM (Random Access Memory). Through this port, one bit is read from or written into each randomly accessed memory cell in the case of a 1-bit output type memory, while in the case of a memory for multi-bit parallel output type, the port is used to read or write a plurality of bits at a time. On the other hand, the serial access port usually has a buffer (hereinafter referred to as "line buffer") corresponding to the number of bits of one word is used to simultaneously receive all the bits in the memory cells connected to the word line selected in accordance with row address information in the cell array and output them serially to the outside.

In such a dual-port memory used as a video memory, the random access port and the serial access port can be used asynchronously so that the read/write of image data between CPU and the video memory and the read-out of display data from the video memory to a display (such as a CRT or a liquid crystal display) can be made asynchronously. Therefore, the dual-port memory can greatly contribute to the improvement in processing efficiency of CPU, high speed display/simplification of display processing and digitallization of TV, VTR, and the like.

In the above dual port memory, the serial access port includes a word data latch circuit (hereinafter referred to as the "line buffer") for holding data derived from one selected word, a serial selection circuit for serially selecting data stored in the line buffer one by one, and a serial port for outputting data designated by the serial selection circuit. In order to accomplish practically the dual port memory having a large memory capacity such as 256 K bits or 1 Mega bits, whole memory cells are splited into a plurality of memory planes. Each of the memory planes is provided with a random access port and a serial access port which includes a line buffer, a serial selection circuit and a serial output circuit. Among the plurality of memory planes, one memory plane is selectively enabled while the remaining other memory planes are disenabled. However, as the number of the memory planes is increased, the number of line buffers as the nuclei of the dual-port memory must be increased in proportion to the number of memory planes. Therefore, though the total area of the cell array does not much change as a whole due to division into the memory planes, the occupying area of the line buffers increases in proportion to the number of the division. As a result, the problem develops in that the memory cell capacity is limited. Particularly because the serial access port having the line buffer must be able to operate asynchronously with the random access port, static type latch circuits not requiring refresh are preferably used for the line buffer even if dynamic memory transistors are used for the memory cells in the array. However, the area necessary for the static latch circuits is by far greater than that of the dynamic latch circuits.

Moreover, in the conventional dual port memory, the bit number of the line buffer is required to be the number of the memory cells which are selected at each access cycle, in each of the memory plane. Thus, as a whole, the bit number in all the line buffers is remarkably large even they are not used simultaneously.

SUMMARY OF THE INVENTION

It is an object of the present invention to provide a semiconductor memory circuit with an improved serial access port which can be fabricated with a reduced number of line buffers.

It is another object of the present invention to provide a dual-port memory which can be fabricated on a reduced area of a semiconductor chip.

The semiconductor memory circuit according to the present invention comprises first and second memory arrays, a common data hold circuit, a first control circuit for enabling one of the first and second memory arrays, and a data transfer circuit which transfers data derived from the first memory array to the common data hold circuit when the first memory array is enabled and transfers data derived from the second memory array to the common data hold circuit when the second memory array is enabled.

According to the present invention, the single common data hold circuit is provided for both of the first and second memory arrays. Therefore, the area on the semiconductor chip required to form the data hold circuit is greatly reduced.

According to one aspect of the present invention, there is provided a memory circuit comprising first and second memory planes, each of the first and second memory planes including first and second memory arrays, each of the first and second memory arrays having a plurality of word lines, a plurality of bit lines intersecting with said word lines and a plurality of memory cells coupled to the word lines and the bit lines; a data hold circuit having a plurality of latch circuits each having an input end and an output end; a first data transfer circuit connected between the bit lines of the first memory array and the input ends of the latch circuits of the data hold circuit; a second data transfer circuit connected between the digit lines of the second memory array and the input ends of the latch circuits of the data hold circuit; a serial data line; a plurality of transfer gates connected between the output ends of the latch circuits and the serial data line; a serial selection circuit coupled to said plurality of transfer gates for sequentially enabling the transfer gates one by one; first means for operatively enabling first transfer circuits of the first and second memory planes simultaneously thereby to transfer data on the bit lines of the first memory arrays of said first and second memory planes to the data hold circuits of the first and second memory planes, respectively;

second means for operatively enabling the second transfer circuits of the first and second memory planes simultaneously thereby to transfer data on the bit lines of the second memory arrays of the first and second memory planes to the data hold circuits of the first and second memory planes, respectively; and third means for enabling the serial selection circuits of the first and second memory planes.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE INVENTION

Prior Art

Figure 1:
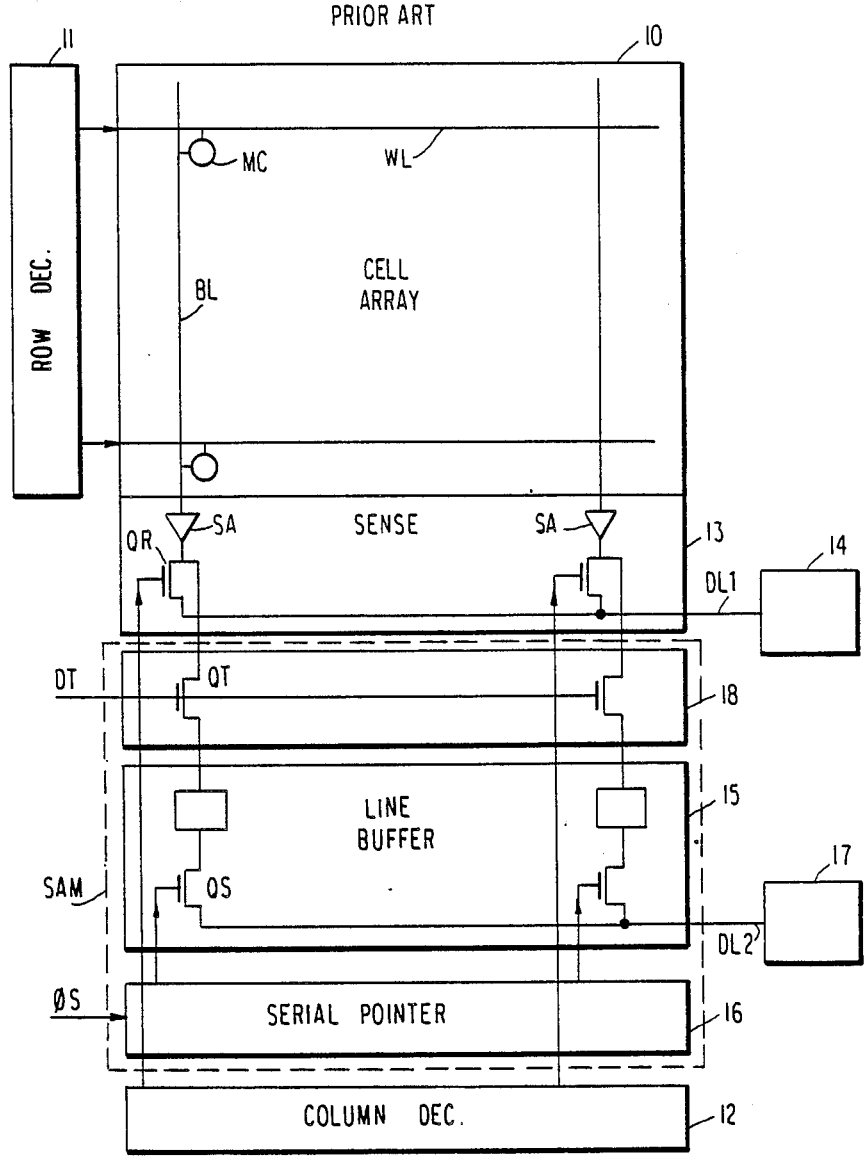
FIG. 1 is a schematic block diagram showing a basic structure of a dual-port memory circuit in the prior art.

Hereinafter, the fundamental concept of the conventional dual-port memory will be explained with reference to a memory block diagram shown in FIG. 1. The random access port (hereinafter referred to as the "RAM port") includes a memory cell array 10, a row decoder 11, a column decoder 12, a sense and selection circuit 13 and a random port 14 for outputting the data read out through the sense amplifiers to the outside and for writing the data inputted from outside into the memory cell array 10. The memory cell array 10 includes word lines WL in rows, bit lines BL in columns, and dynamic type memory cells MC coupled to the the word lines and the bit lines in a known way. The sense and selection circuit 13 includes sense amplifiers SA provided in columns and column selection transfer gate transistors QR coupled between outputs of the sense amplifiers SA and a data line $DL_1$ connected to an random I/O port 14. The outputs of the column decoder 12 are applied to gates of the transistors QR to make one of the transistors QR conductive.

The serial access port SAM includes a word data holding circuit (hereinafter referred to as the "line buffer") 15 for temporarily holding the data of one word (all the cells connected to one word line) inside the memory cell array 10, a serial pointer 16 (usually, a programmable shift register) for arbitrarily sequencing the data bits in a word stored in the line buffer in response to a clock signal $\phi_S$, and a serial port 17 for outputting serially the bit designated by the serial pointer 16 to the outside or for writing the data inputted serially from outside into the line buffer. A necessary number of external terminals (not shown) are connected to the random port 14 and to the serial port 17.

The line buffer 16 includes a plurality of latch circuits such as static type flip-flops FF and a plurality of serial transfer gate transistors QS coupled between output terminals of latch circuits FF and a serial data line $DL_2$ connected to a serial port 17. The gates of the transistors QS are connected to the outputs of the serial pointer 16 and rendered conductive one by one. A data transfer circuit 18 includes a plurality of transfer gate transistors QT connected between the outputs of the sense amplifiers SA and the inputs of the latch circuits FF in the line buffer 15 for simultaneously transferring data from the sense amplifiers SA to the latch circuits FF in response to an active level of a control signal DT.

The operation of the dual-port memory described above will be explained. If the serial access port SAM is removed from the circuit shown in FIG. 1, the resulting circuit is the same as the conventional random access memory, whereby row address information given from outside is inputted to the row decoder 11 to select one word line WL and column address information is inputted to the column decoder 12 to select one bit line by making one transistor QR conductive. As a result, access is made to the memory cell positioned at the point of intersection of these selected word line and bit line and read/write of the data is carried out in accordance with a read/write mode via the random port 14. On the other hand, the line buffer 15 of the serial access port SAM is connected to each input/output node of the sense and selection circuit 13 inside the random access port through the transfer circuit 18 and is designed so that all the transfer gates are opened only in a specific cycle called a "data transfer mode" in response to DT thereby to connect electrically the memory cell array 10 and the line buffer 15 to each other. This data transfer mode represents a memory cycle in which the random access port is neither in the read cycle nor in the write cycle and during this period, the data from one word in the memory cell array 10 are altogether transferred to the line buffer 15 or the data for one word in the line buffer 15 are altogether transferred to the memory cell array 10.

When the data for one word in the memory cell array 10 are written into the line buffer 55 by the data transfer mode, all the transfer gate transistors QT are closed. As a result, the random access port and the serial access port are cut off electrically from each other. Therefore, it is possible, for example, to output serially the content of the line bufrer 15 to the outside from the serial port 17 and simultaneously to write data from outside into the memory cell array 10 through the random port 14 or to read the data to the outside. In other words, since the random access port and the serial access port can be operated simultaneously and asynchronously with each other, the efficiency of use of the memory can be improved drastically. Incidentally, if the capacity of a plurality of words (e.g. four words) is provided to the line buffer 15 of the serial access port, 4-bit parallel data can be obviously inputted and outputted simultaneously through the serial port 17.

Figure 2:
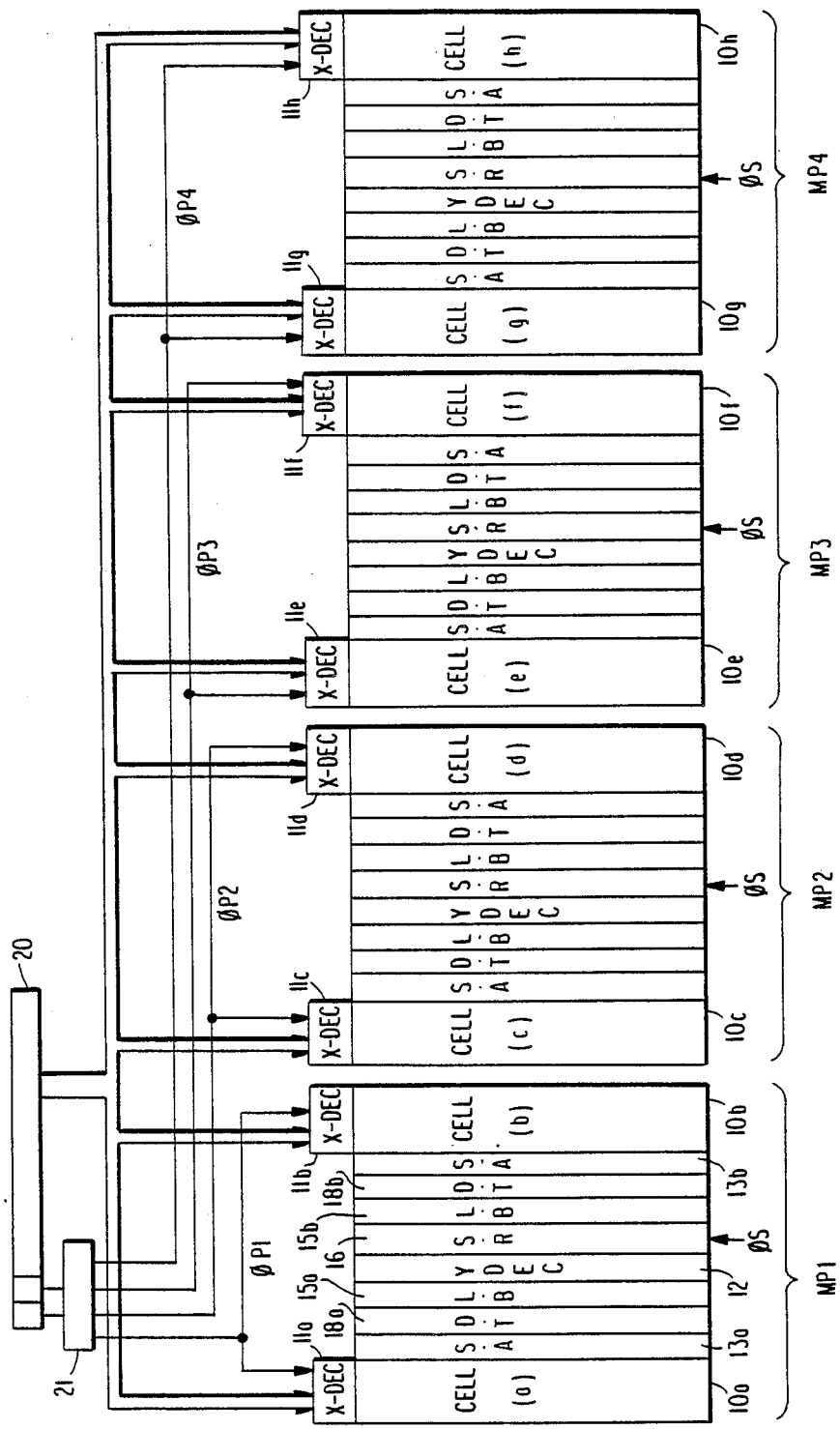
FIG. 2 is a schematic block diagram shown in a chip layout of the dual-port memory in the prior art.

In order to accomplish practically the dual-port memory such as shown in FIG. 1 on a chip, layout design such as shown in FIG. 2 is employed. In other words, the memory cell array 10 of FIG. 1 is divided into two arrays 11a and 11b, which are disposed on the right and left. A sense and selection circuit 13a and a line buffer 15a for the cell array 11a and those for the cell array 11b are provided to these cell arrays 11a and 11b, respectively, and a column decoder 12 and a serial pointer 16 are disposed at their center, as illustrated. This arrangement is employed primarily in order to prevent deterioration of sensitivity of the sense amplifiers. If the cell array has a one-block structure, bit lines get elongated so that stray capacitance between bit lines increases and the load (the number of cells) of the sense amplifiers increases, thereby reducing sensitivity of the sense amplifiers. Furthermore, the pre-charge time of the bit line gets elongated and the response speed of the memory drops. For this reason, the cell array is divided into a plurality of blocks to reduce the length of the bit line and the sense amplifier is disposed for each block to prevent the drop of sensitivity. The pre-charge time is shortened to attain high speed response. Incidentally, the row decoder is divided in accordance with the division of the cell array, too, but the row address is applied in common to the divided row decoders 11a, 11b and the two cell arrays 10a and 10b are simultaneously activated. Therefore, the cell arrays 11a and 11b in FIG. 2 together serve for one word of the memory cell array 10 shown in FIG. 1.

The basic structure of the dual-port memory has thus been described with reference to FIGS. 1 and 2, but a further improvement is necessary in order to integrated a large capacity memory on one chip.

One of the requirements is low power consumption by low voltage driving.

Figure 3:
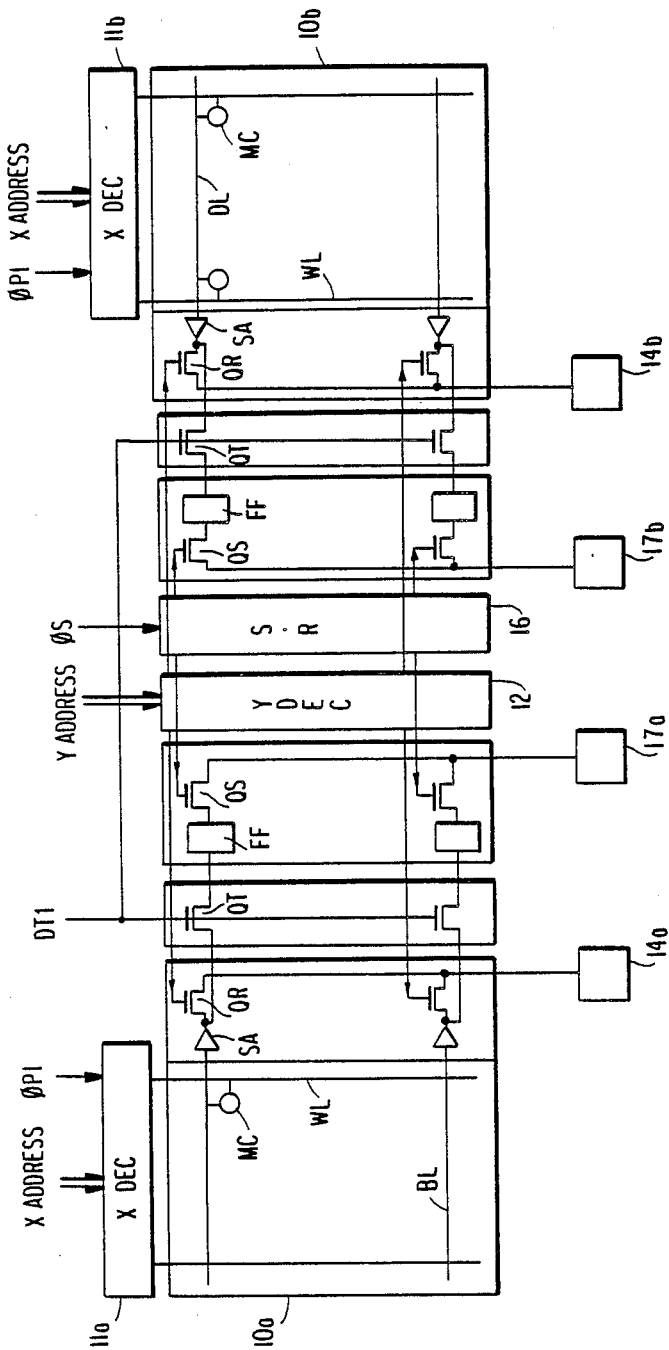
FIG. 3 is a schematic block diagram of one memory plane in the memory of FIG. 2.

An improvement proposal shown in FIG. 3 has been made in order to satisfy this requirement. FIG. 3 is a layout diagram of an improved dual-port memory chip. As is obvious from this diagram, the memory is divided as a whole into a plurality of memory planes $MP_1$–$MP_4$ and only one arbitrary plane is selected in accordance with the content of the upper-order bit of the row address with the other planes being non-selected by a plane decoder 21. Hereinafter this system is referred to as a "decoder division system". Each plane has the same memory layout as that of FIG. 2 and it is possible to regard a plurality of memories as together constituting one large capacity memory. In FIG. 3, the upper-order two bits of the row address inputted to a row address buffer 20 are applied to a pre-decoder 21 and two row decoders 11a, 11b inside each plane are selected at the same time in accordance with their content. For instance, the plains MP1-MP4 are selected respectively when the upper-order bits are "00", "01", "10" and "11" through selection signals $\emptyset_{P1}$–$\emptyset_{P4}$. The other bits of the row address other than these upper-order two bits are applied in common to the row decoders 11a, 11b in each plane.

According to this arrangement, only one plane is selected in accordance with the content of the upper-order two bits of the row address. The selected plane is activated and exhibits the memory operation but the rest of the planes which are under the non-selection state are inoperative. Therefore, the decoders and the sense amplifiers are inoperative in these inoperative planes and the memory is not refreshed. Therefore, power is consumed in only the selected plane and unnecessary power consumption in the other planes can be saved. Thus, the requirement for low power consumption can be satisfied.

As described above, the large-capacity dual-port memory can now operate with low power consumption but the following problems become remarkable and further improvements are necessary.

As the division of the cell array proceeds, the number of line buffers as the nuclei of the dual-port memory must be increased in proportion to the number of division. Therefore, though the total area of the cell array does not much change as a whole due to division, the occupying area of the line buffers increases in proportion to the number of division. As a result, the problem develops in that the memory cell capacity is limited. Particularly because the serial access port having the line buffer must be able to operate asynchronously with the random access port containing the cell array, static type memory not requiring refresh are preferably used for the line buffer even if dynamic memory cells are used for the memory cells in the array. However, the area necessary for the static memory is by far greater than that of the dynamic memory. Furthermore, a complementary MOS transistor (CMOS) structure may be employed in order to reduce power consumption of the line buffer itself. Therefore, in order to fabricate a buffer having a one-word capacity as the line buffer, an area of about ten times the occupying area of the memory cells for one word in the memory cell array 11 becomes necessary. Thus there occurs a problem in that the occupying are of the line buffer cannot be neglected with the increase in the number of division of the memory cell array.

If two line buffers 15a, 15b existing in one plane can be used commonly, the overall occupying area of the line buffers can be halved but as shown in FIGS. 2 and 3, so long as the two blocks in one plane (that is, the block containing the cell array 10a and the block containing the cell array 10b in the case of plane MP1) are selected simultaneously, it is difficult to use in common the line buffers 15a and 15b existing there. This will be explained in further detail with reference to FIG. 2.

As typified by FIG. 2, each plane has two divided blocks. The memory cell array 10a and its sense amplifier group 13a, its line buffer 15a and its row decoder 11a exist in the first block, and the memory cell array 10b, its sense amplifier group 13b, its line buffer 15b and its row decoder 11b exist in the second block. It is possible to commonly use the column decoder 12 for selecting commonly the digit lines of the two cell arrays 10a and 10b and the serial pointer 16 for commonly designating the address of the two line buffers 15a and 15b. The memory cell array 10a and the line buffer 15a are connected by the first transfer circuit 18a and the memory cell array 10b and the line buffer 15b are connected by the second transfer circuit 18b. These first and second transfer circuits 18a, 18b are simultaneously turned ON/OFF by the control signal DT from a control circuit 22.

Assuming that the line buffers 15a and 15b each have one-word capacity, data corresponding to one word are simultaneously transferred from the memory cell arrays 10a and 10b to the corresponding line buffers 11a and 11b, respectively. The data thus transferred are outputted simultaneously to the outside through the serial ports 14a, 14b in the sequence of bits designated by the serial pointer 12. As a result, two-bit data can be transferred in parallel in response to $\emptyset_s$.

If the line buffers 15a and 15b are replaced by one line buffer, data transfer from each memory cell array 10a, 10b to the line buffer must be made on the time division basis. Therefore, the structure of the control circuit 22, too, must be changed so that ON/OFF of the respective transfer gate groups 18a and 18b can be made on the time division basis with the result being in an extremely complicated circuit structure. Furthermore, the period twice as long as the original period must be allotted as the data transfer mode in order to accomplish the data transfer mode and this results in the extension of the data transfer time. Moreover, since only one-bit data can be transferred at one time from the serial port, the data transfer time with the outside gets prolonged. As described above, it has been extremely difficult to reduce the number of line buffers.

Embodiment

Figure 4:
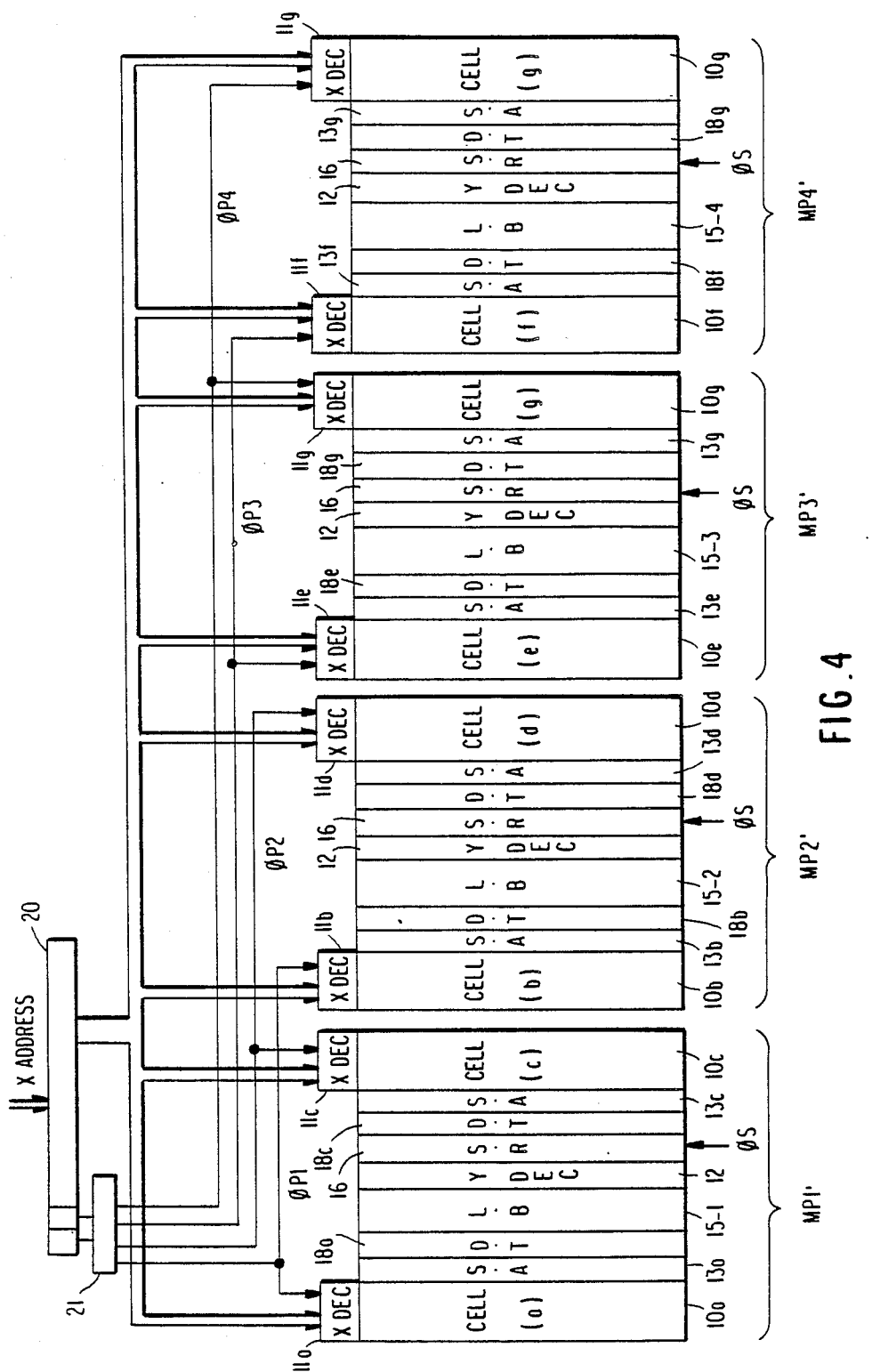
FIG. 4 is a schematic block diagram showing a chip layout of a dual-port memory according to first embodiment of the present invention.

Next, one embodiment of the present invention will be described in detail with reference to FIG. 4. FIG. 4 is a chip layout diagram when the present invention is applied to a dual port memory having four planes MP1'-MP4'. Four planes MP1'-MP4' are formed on a single semiconductor chip and two memory arrays (block) 10a and 10b are disposed in each plane in the same way as in the prior art device. However, one of the memory arrays (the array containing the memory cell array 10b, the row decoder 11b and the sense amplifier group 13b in FIG. 2) of the two memory arrays that have been disposed conventionally in the same plane MP1 is disposed in a different plane e.g. MP2' from plane MP1'. On the other hand, one of the blocks (the block containing the memory cell array 10c, the sense amplifier group 13c and the row decoder 10c in FIG. 1) of the two memory arrays that have conventionally been disposed in plane MP2 is disposed in plane MP1'. Similarly, one of the memory array 10f in the conventional plane MP3 and one of the memory arrays 10g in the conventional plane MP4 are substituted with each other and disposed as shown in the drawing. Incidentally, since the eight memory blocks in FIG. 1 may have the same circuit structure, substitution of the block itself is not necessary and only the change of wirings of the selection signal for selecting the decoders is necessary. Therefore, neither drastic change of circuit design nor any additional circuits for control are necessary and design as well as fabrication are extremely easy.

The line buffers (the portions represented by oblique lines in the drawing) in each plane can be made common by making the layout as described above. Therefore, the occupying area of the line buffers can be reduced by half as a whole in comparison with the prior art technique.

Incidentally, in the practical operation, the upper two bits of the row address inputted to the row address register 20 are decoded by the pre-decoder 21. When the first selection signal $\phi_{P1}$ is generated as a result, the array 10a in plane MP1' and the memory array 10b in plane MP2' are selected in practice with all the other memory arrays 10c to 10h being under the non-selection condition. In the selected two memory arrays 10a in MP1' and 10b in MP2', the respective row decoders 11a and 11b are activated and the remaining bits other than upper two bits of the row address are commonly decoded thereby. As a result, the respective random access port and serial access port become operative for these two activated memory arrays 10a and 10b and if the mode using the random access port is set, data transfer can be made between the memory cell arrays 10a and 10b and the external apparatus (e.g. CPU) through the random access port. If the data transfer mode is set, the data for one word are transferred to the line buffer of plane MP1' through the sense amplifier group 13a in the memory array 10a and at the same time, the data for one word are transferred to the line buffer of plane MP2' through the sense amplifier group 13b in the memory block 13b. Since the memory array 10c inside plane MP1' and the memory array 10d inside plane MP2' are inoperative during this period, they do not exert any influences on the line buffers. Furthermore, when the data transfer mode is complete, the data are outputted one bit by one simultaneously and serially from the line buffers of planes MP1' and MP2' to the external apparatus (e.g. CRT or a liquid crystal display) through the respective corresponding serial ports. Since this operation is conducted asynchronously with the operation of the random access port, it is possible to execute random access and serial access in the overlapping arrangement.

Figure 5:
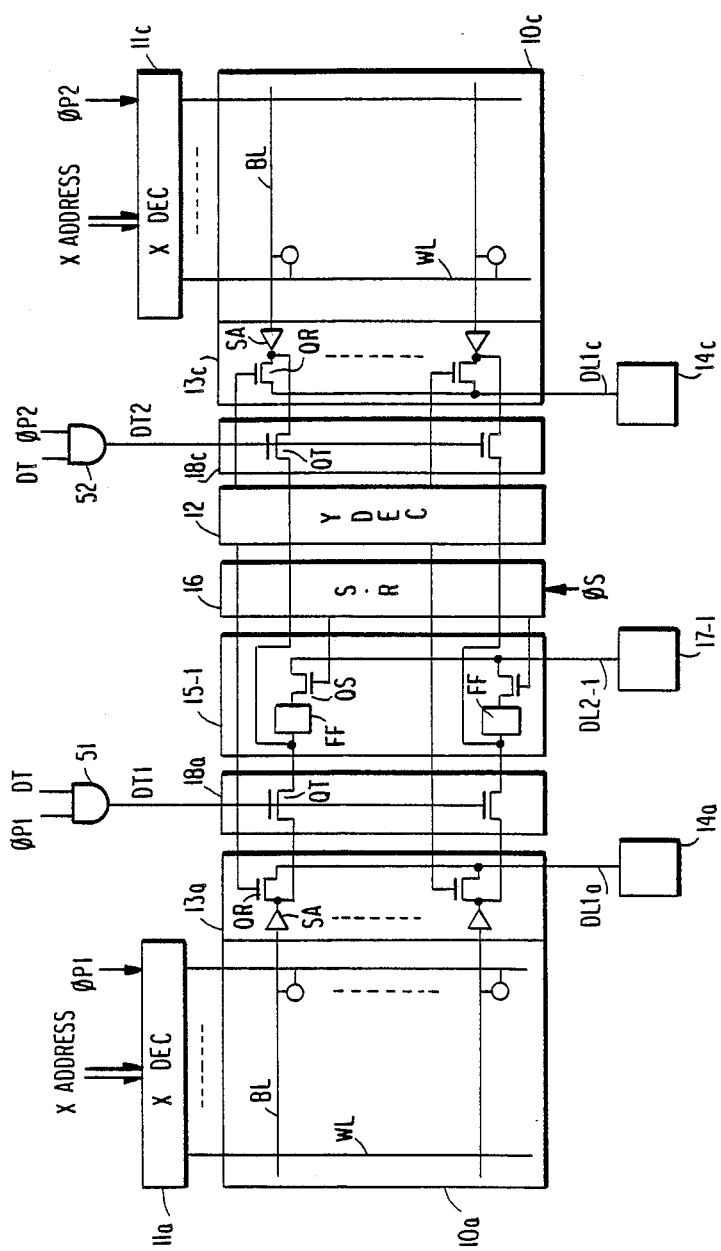
FIG. 5 is a schematic block diagram showing a detailed structure of one memory plane in FIG. 4.

FIG. 5 shows the internal circuit block diagram of plane MP1' shown in FIG. 5 as a typical example and the operation inside this plane in the data transfer mode will be explained in more detail. As is obvious from FIG. 5, the row decoder 11a of the memory array 10a is connected to the decoder selection signal line $\phi_{P1}$ generated by a AND gate 51 and the row decoder 11c of the memory array 10c is connected to the decoder selection line $\phi_{P2}$ generated by a AND gate 52. A single line buffer 16-1 having storage bits of the same number of the columns of the blocks 10a and 10b is used in common for the memory arrays 10a and 10c in the plane MP1'. Each of the sense amplifier groups 13a and 13c includes a plurality of sense amplifiers SA having inputs connected to the bit lines BL in the arrays 10a and 10c and a plurality of column selection transistors QR coupled between the outputs of the sense amplifiers SA and the data lines DL1a and DL1c coupled to the random ports 14a and 14c, respectively. The column selection transistors QR of the sense amplifier groups 13a and 13c are supplied with the outputs of the column decoder 12 in common. The line buffer 15-1 in the plane MP1' includes a plurality of latch circuits FF and a plurality of transfer gate transistors QS connected between the outputs of the latch circuits FF and the serial data line DL2-1 connected to the serial port 17-1. The transfer circuit 18a includes data transfer transistors QT connected between the outputs of the sense amplifiers SA in the group 13a and the inputs of the latch circuits FF while the transfer circuit 18c includes transistors QT connected between the outputs of sense amplifiers SA in the group 13c and the inputs of the latch circuits FF in the line buffer 15-1. The numbers of the latch circuits, the transistor QR in the group 13a, the transistors QR in the group 13c, the transistors QT in the transfer circuits 18a and 18c are the same as the number of bit lines in the blocks 10a and 10c. The transfer circuit 18a is enabled in response to a control signal DT1 when the row decoder 11a is enabled in response to $\phi_{P1}$, while the transfer circuit 18c is enabled in response to a control signal DT2 when the row decoder 11c is enabled in response to $\phi_{P2}$. The column decoders 12 and the serial pointers 16 in the respective planes MP1'-MP4' operate simultaneously. However, it is also possible to operate the column decoders and the serial pointers of the selected planes e.g. MP1' and MP2'.

When the memory arrays 10a in MP1' and 10b in MP2' are selected in response to $\phi_{P1}$ under the construction described above, the memory array 10a of plane MP1' and the memory block 10b of plane MP2' are simultaneously activated. When the data transfer mode is set, the signal DT1 is generated and the transfer gate circuit 18a for the memory array 10a of plane MP1' and the transfer circuit 18c in the memory array 10b of plane MP2' are simultaneously turned conductive. Since the signal DT2 is not made active at this time, the transfer gate circuit 18c for the memory array 10c of plane MP1' and the transfer circuit 18d in the memory array 10d of plane MP2' are turned OFF. Therefore, the line buffers 16-1 and 16-2 of the planes MP1' and MP2' are electrically connected to the memory cell arrays 10a and 10b, respectively while they are electrically cut off from other memory arrays 10c and 10d so that the line buffer can be used in common for two blocks in each plane. The serial port, too, can be used in common in each plane.

Figure 6:
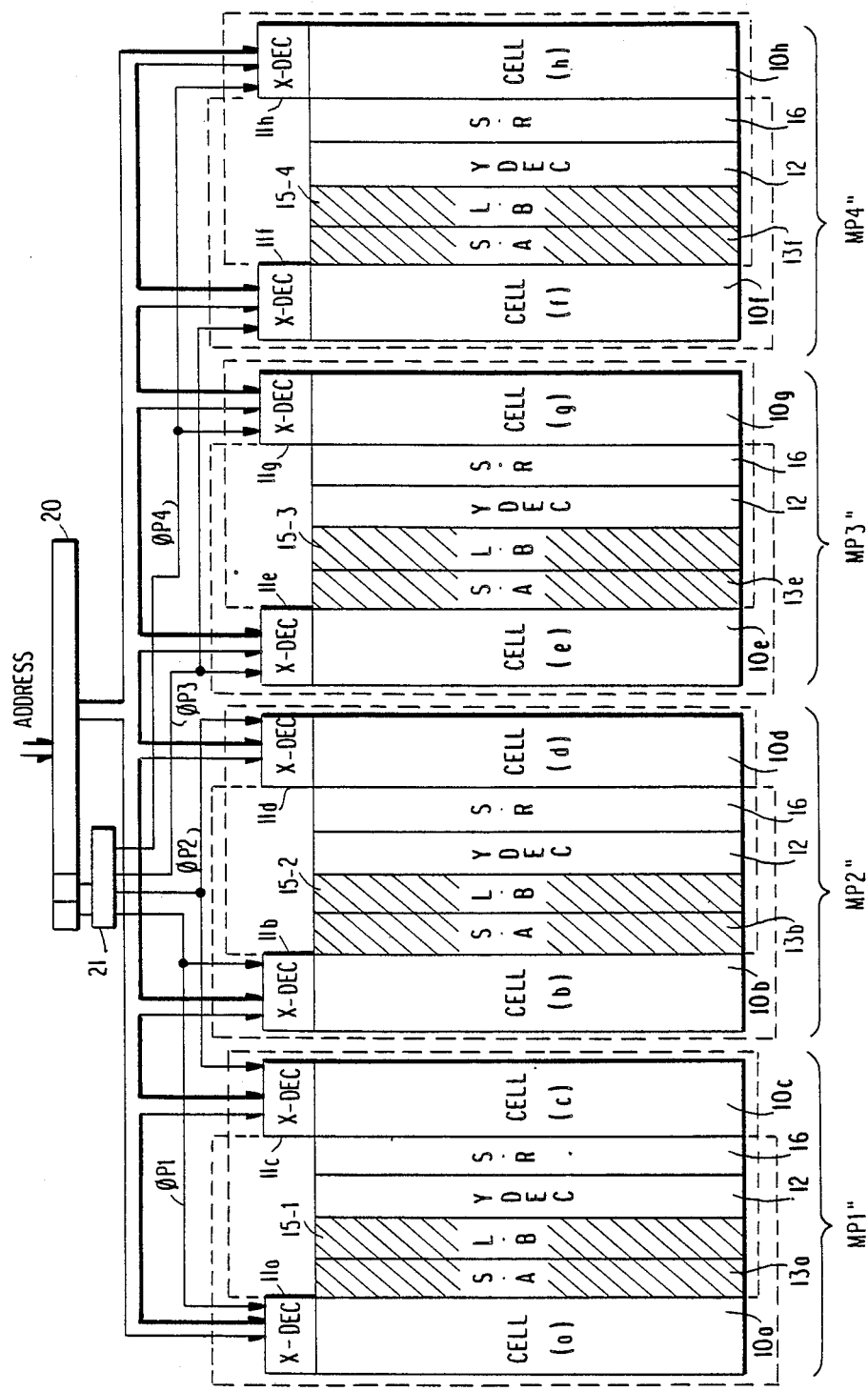
FIG. 6 is a schematic block diagram showing a layout of the dual-port memory circuit according to a second embodiment of the present invention.
Figure 7:
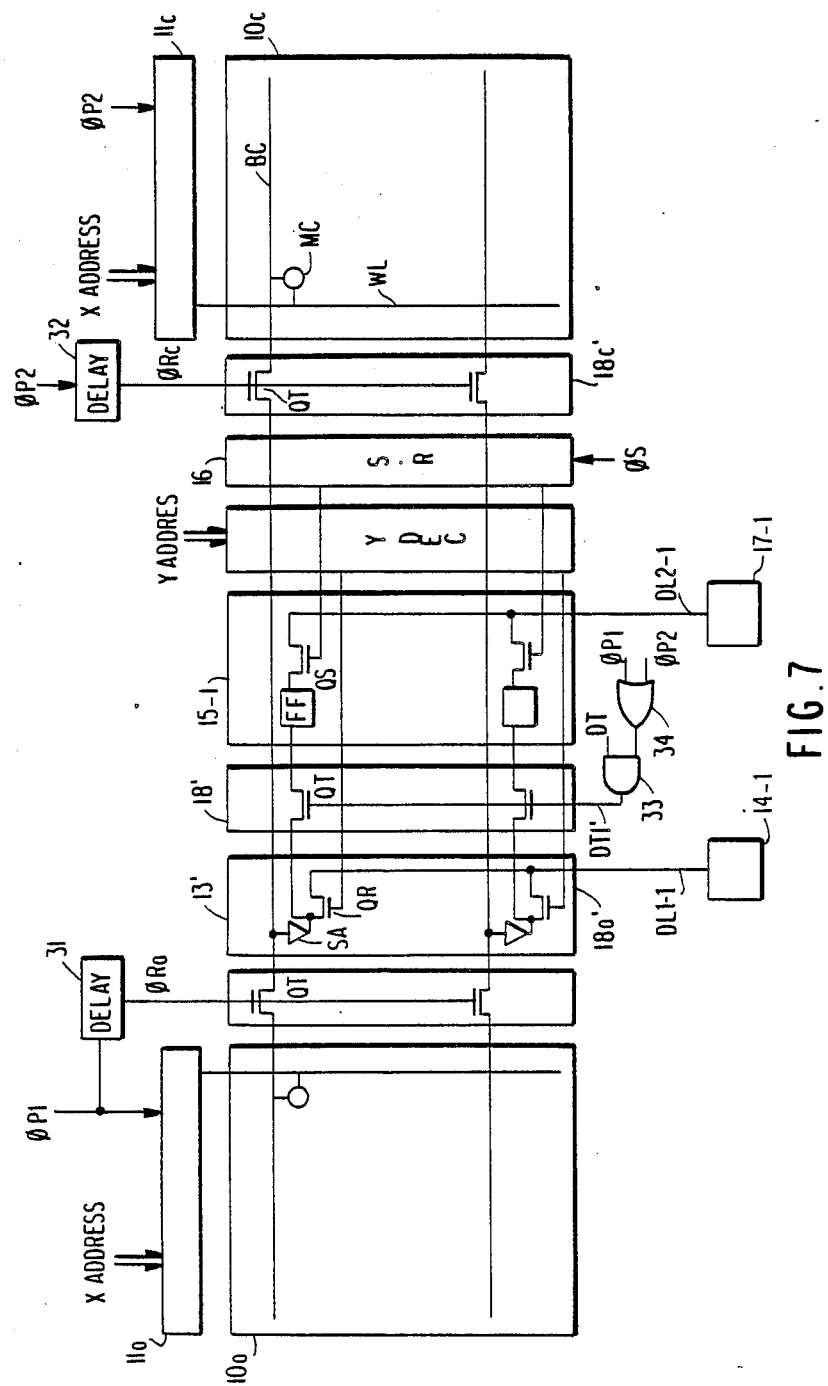
FIG. 7 is a schematic block diagram showing a detailed structure of the memory plane of FIG. 6.

With reference to FIGS. 6 and 7, the dual-port memory circuit according to a second embodiment of the present invention will be explained.

In this embodiment, not only the line buffer but also the sense amplifiers SA in each plane are used in common. Here, when the data amplified by the sense amplifiers SA are transferred to the line buffer 16, the transfer gate circuit 18 for connecting the line buffer 16 to the sense amplifiers SA are used in common for the two memory arrays 10a and 10c as shown in FIG. 7. However, since the sense amplifiers SA are used in common, each memory cell arrays 10a and 10b must be connected by separate transfer gate circuits 18a' and 18c'. Therefore, a cell array selection signals $\emptyset_{Ra}$ and $\emptyset_{Rc}$ for selecting the transfer gate circuits 18a' and 18c' in accordance with which array is used must be provided. However, it is possible to employ a circuit arrangement wherein the cell array selection signals $\emptyset_{Ra}$, $\emptyset_{Rc}$ is omitted and either one of the transfer gate circuits is enabled in synchronism with the corresponding row decoder by the decoder selection signal $\emptyset_{P1}$, $\emptyset_{P2}$. In accordance with this embodiment, the sense amplifier, too, can be used commonly by making some changes of the circuit.

The two embodiments of the present invention have thus been described with reference to FIGS. 4 to 7. If the line buffer in each plane in these embodiments has a two-word capacity, however, 4-bit data can be taken out serially and in parallel through the serial access port. However, if one line buffer is divided into two systems and is provided with two word capacity, each line buffer of the two systems can be disposed very closely and adjacent to one another and moreover, both of them can be made operative simultaneously. In a high density chip layout, therefore, there are the possibility of the occurrence of mutual interference between the line buffers of the two systems and the possibility of signal leakage and inversion of bit data.

Figure 8:
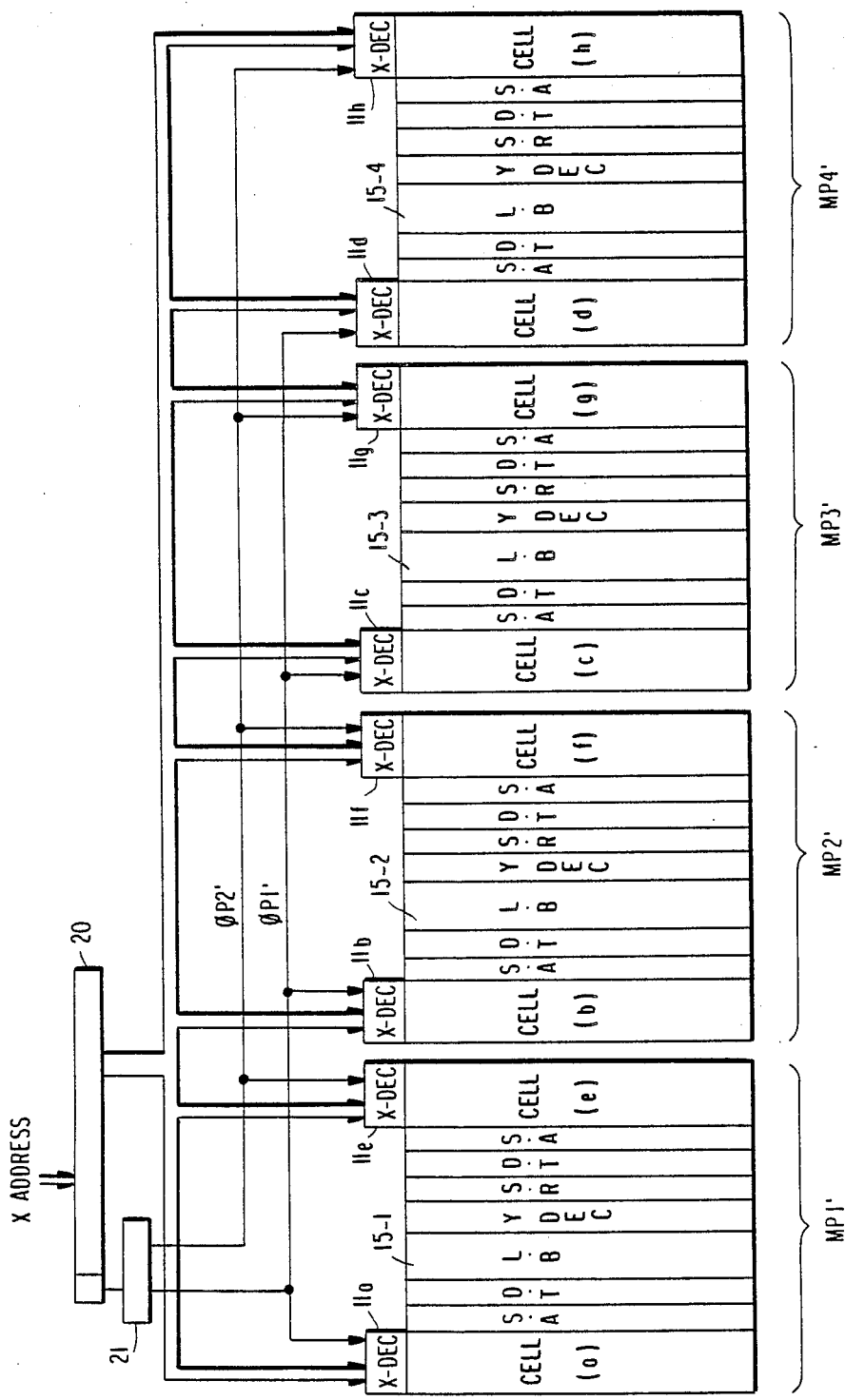
FIG. 8 is a schematic diagram showing a layout of the dual-port memory according to a third embodiment of the present invention.

A circuit arrangement shown in FIG. 8 may be employed in order to solve such problems.

FIG. 8 is a layout diagram showing still another embodiment of the present invention.

As is obvious from this diagram, two memory arrays are disposed in each plane and one line buffer is disposed in each plane. Then, the arrangement is made so as to select exclusively one of the memory arrays 10a, 10b, 10c, 10d of each plane and the other memory arrays 10e, 10f, 10g, 10h. To this end, the output signal lines of the decoder 21 are arranged so that when the upper one bit of the row address is at the "H" level, the memory array 10a–10d is selected and when it is at the "L" level, the memory array 10e–10h is selected.

As a result, one of the memory arrays of each of four planes is simultaneously activated and 4-bit data can be taken out from the line buffers that are disposed at physically spaced-apart positions. In this manner, adverse influences due to mutual interference of the line buffers can be eliminated and this is extremely advantageous for high density integration. Incidentally, since no power is consumed by the memory block under the non-selection state in each plane, low power consumption is not impeded.

Effect of the Invention

As described above, the present invention provides the excellent effect in that the occupying area of the line buffer can be reduced without requiring any complicated circuit or design change. Moreover, the advantages of the decoder division system and the cell array division system are not lost. Particularly, the present invention can reduce by half the area in comparison with the prior art in accordance with which the area corresponding to about 10 word lines is necessary for one line buffer. This can greatly contribute to the improvement in a greater memory capacity. A further greater effect can be obtained because not only the line buffer but also the sense amplifier and the serial port can be used in common as represented by various foregoing embodiments.

Incidentally, the present invention can be applied not only to the circuit arrangement wherein the memory cell array portion consists of dynamic memories and the line buffer consists of static memories but also to the circuit arrangement wherein both of them consist of static memories or dynamic memories.

I claim:

1. A semiconductor memory circuit comprising; first and second memory planes separate from each other, each of said first and second memory planes including first and second memory arrays separate from each other, each of said first and second memory arrays having a plurality of word lines consecutively arranged in a first number of rows, a plurality of bit lines arranged in a second number of consecutive columns and a plurality of memory cells coupled to the word lines and the bit lines, a plurality of latch circuits of said second number, each of said latch circuits having an input end and an output end and storing data applied to the input end thereof, a plurality of first transfer circuits of said second number coupled between the bit lines in said second number of columns of said first memory array and the input ends of said latch circuits of said second number for operatively establishing signal paths therebetween, respectively, a plurality of second transfer circuits coupled between the bit lines in the second number of columns of said second memory array and the input ends of said latch circuits of said second number for operatively establishing signal paths therebetween, respectively, a first data line, a plurality of third transfer circuits of said second number connected between the output ends of said latch circuits and said first data line, respectively, a serial selection circuit coupled to said third transfer circuits for selectively enabling said third transfer circuits one by one in sequence, a first row decoder for operatively selecting one of the word lines of said first memory array, and a second row decoder for operatively selecting one of the word lines of said second memory array, a first selection circuit for enabling said first row decoders of said first and second memory planes simultaneously in a first mode and enabling said second row decoders of said first and second memory planes simultaneously in a second mode, and a second selection circuit for enabling said first transfer circuits of said first and second memory planes simultaneously in said first mode and enabling said second transfer circuits of said first and second memory planes simultaneously in said second mode.

2. The memory circuit according to claim 1, in which each of said first and second memory arrays further includes a plurality of sense amplifiers of said second number provided for the columns thereof.

3. The memory circuit according to claim 1, wherein said first selection circuit includes a decoder receiving at least one row address signal.

4. The memory circuit according to claim 1, in which each of said first and second transfer circuits includes a sense amplifier and a transfer gate connected to said sense amplifier.

5. The memory circuit according to claim 1, in which each of said first and second memory planes further includes second and third data lines, a plurality of first column transfer gates of said second number coupled between the bit lines of the first memory array thereof and said second data line, a plurality of second transfer gates coupled between the bit lines of the second memory array thereof and said third data line, and a column decoder for selecting one of said first column transfer gates and one of said second column transfer gates.

6. A semiconductor memory circuit comprising; first and second memory arrays separate from each other, each of said first and second memory arrays including a first number of word lines, a second number of bit lines intersecting with said word lines and a plurality of memory cells coupled to said word lines and bit lines, a plurality of latch circuits of said second number, each of said latch circuits having an input end and an output end and storing a data signal applied to the input end thereof, a plurality of first transfer circuits of said second number coupled between the bit lines of said first memory array and the input ends of said latch circuits for operatively transferring signals at said bit lines of said first memory array to said input ends of said latch circuits, respectively, a plurality of second transfer circuits of said second number coupled between the bit lines of said second memory array and the input ends of said latch circuit for operatively transferring signals at the bit lines of said second memory array to the input ends of said latch circuits, respectively, a first row decoder for operatively selecting one of the word lines of said first memory array, a second row decoder for operatively selecting one of the word lines of said second memory array, a first data line, a plurality of first selection switches of said second number connected between the output ends of said latch circuits and said first data line, respectively, a serial selection circuit for selecting said first selection switches one by one in sequence thereby to serially transfer signals at the output ends of said latch circuits to said first data line, a second data line, a plurality of second selection switches of said second number connected between the bit lines of said first memory array and said second data line, respectively, a third data line, a plurality of third selection switches of said second number connected between the bit lines of said second memory array and said third data line, respectively, a column decoder for selectively enabling one of said second selection switches and one of said third selection switches, first control means for selectively enabling one of said first and second row decoders, second control means for enabling said first transfer circuits when said first row decoder is enabled and enabling said second transfer circuits when said second row decoder is enabled, a serial port coupled to said first data line, a first random access port coupled to said second data line and a second random access port coupled to said third data line.

7. The memory circuit according to claim 6, in which each of said first and second transfer circuits includes a sense amplifier having an input end coupled to one of the bit lines and an output end, and a transfer gate coupled between the output end of said sense amplifier and the input end of the associated latch circuit.

* * * * *

UNITED STATES PATENT AND TRADEMARK OFFICE
CERTIFICATE OF CORRECTION

PATENT NO. : 4,937,788
DATED : June 26, 1990
INVENTOR(S) : Moemi HARADA

It is certified that error appears in the above-identified patent and that said Letters Patent is hereby corrected as shown below:

On the title page, item [30]:

In the Priority Data delete "62-5232" and insert
--63-5232--

Signed and Sealed this

Twenty-ninth Day of October, 1991

Attest:

HARRY F. MANBECK, JR.

*Attesting Officer*  Commissioner of Patents and Trademarks